(12) United States Patent
Maejima et al.

(10) Patent No.: US 7,542,321 B2
(45) Date of Patent: Jun. 2, 2009

(54) SEMICONDUCTOR MEMORY DEVICE WITH POWER SUPPLY WIRING ON THE MOST UPPER LAYER

(75) Inventors: Hiroshi Maejima, Milpitas, CA (US); Takumi Abe, Mountain View, CA (US); Makoto Hamada, Mountain View, CA (US)

(73) Assignee: Kabushiki Kaisha Toshiba, Tokyo (JP)

( * ) Notice: Subject to any disclaimer, the term of this patent is extended or adjusted under 35 U.S.C. 154(b) by 109 days.

(21) Appl. No.: 11/782,311

(22) Filed: Jul. 24, 2007

(65) Prior Publication Data

US 2009/0027941 A1 Jan. 29, 2009

(51) Int. Cl.
*G11C 5/02* (2006.01)
(52) U.S. Cl. .......................................... 365/51; 365/63
(58) Field of Classification Search ............... 365/51, 365/63
See application file for complete search history.

(56) References Cited

U.S. PATENT DOCUMENTS

| 6,807,120 | B2 * | 10/2004 | Sekiguchi et al. ............ 365/214 |
| 6,944,080 | B2 * | 9/2005 | Sekiguchi et al. ............ 365/214 |
| 2006/0198196 | A1 | 9/2006 | Abe et al. |

FOREIGN PATENT DOCUMENTS

JP       2006-245547       9/2006

* cited by examiner

*Primary Examiner*—Son Dinh
(74) *Attorney, Agent, or Firm*—Oblon, Spivak, McClelland, Maier & Neustadt, P.C.

(57) ABSTRACT

A memory cell array in a semiconductor substrate has a plurality of memory cells arranged in rows and columns. A first circuit is located at one end of the memory cell array in a column direction. A second circuit is located at the other end of the memory cell array in the column direction. A first wire is located above the memory cell array between the first circuit and the second circuit. The first wire is located in a most upper layer in the semiconductor substrate to supply power to the second circuit.

20 Claims, 11 Drawing Sheets

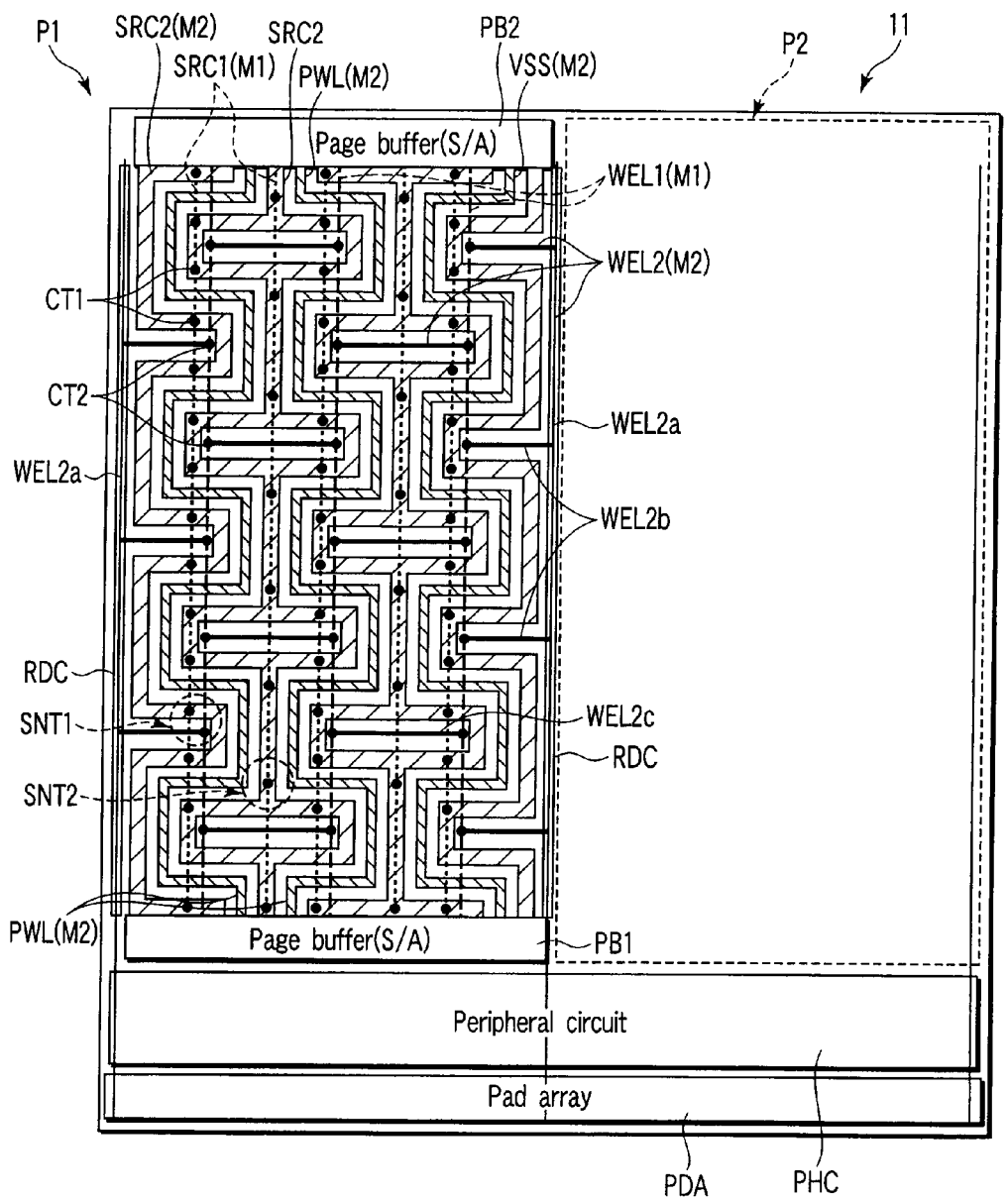
F I G. 1

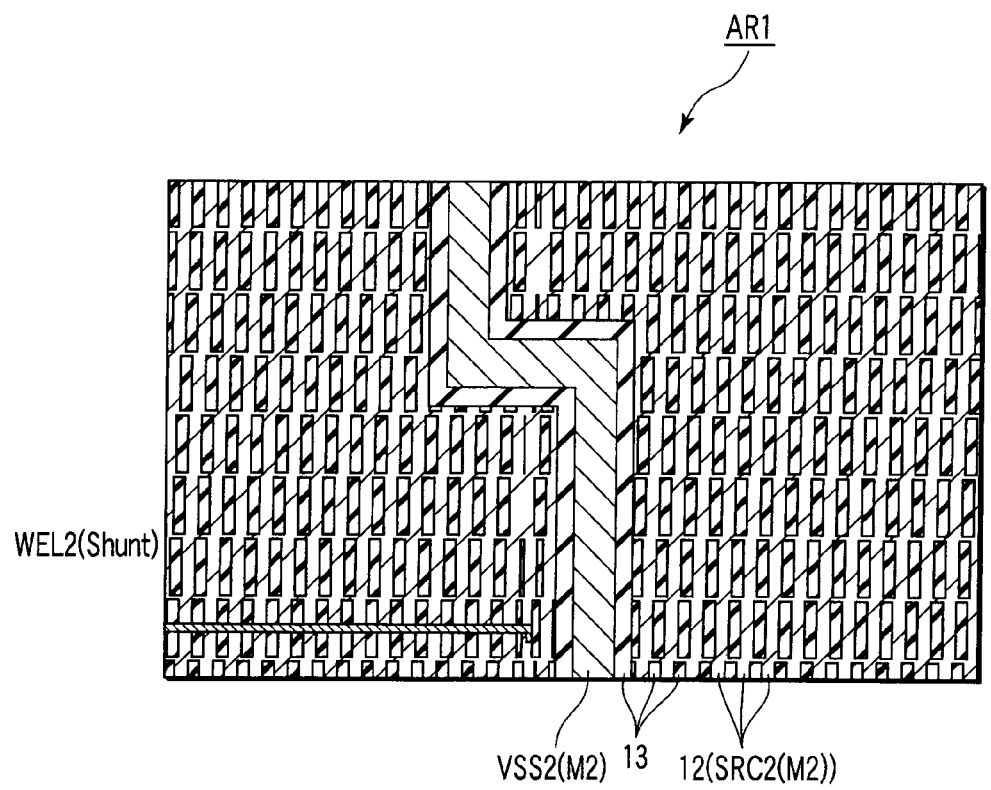
F I G. 6

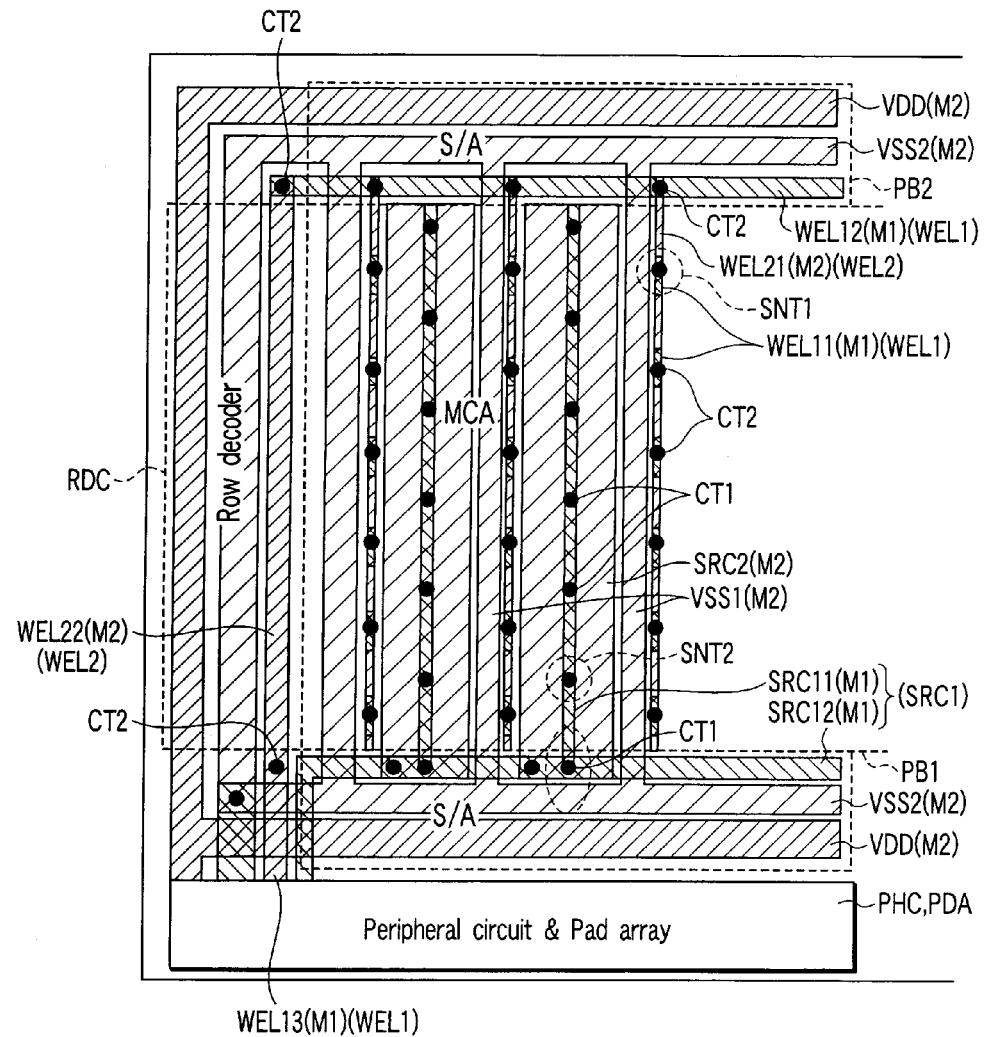
F I G. 8

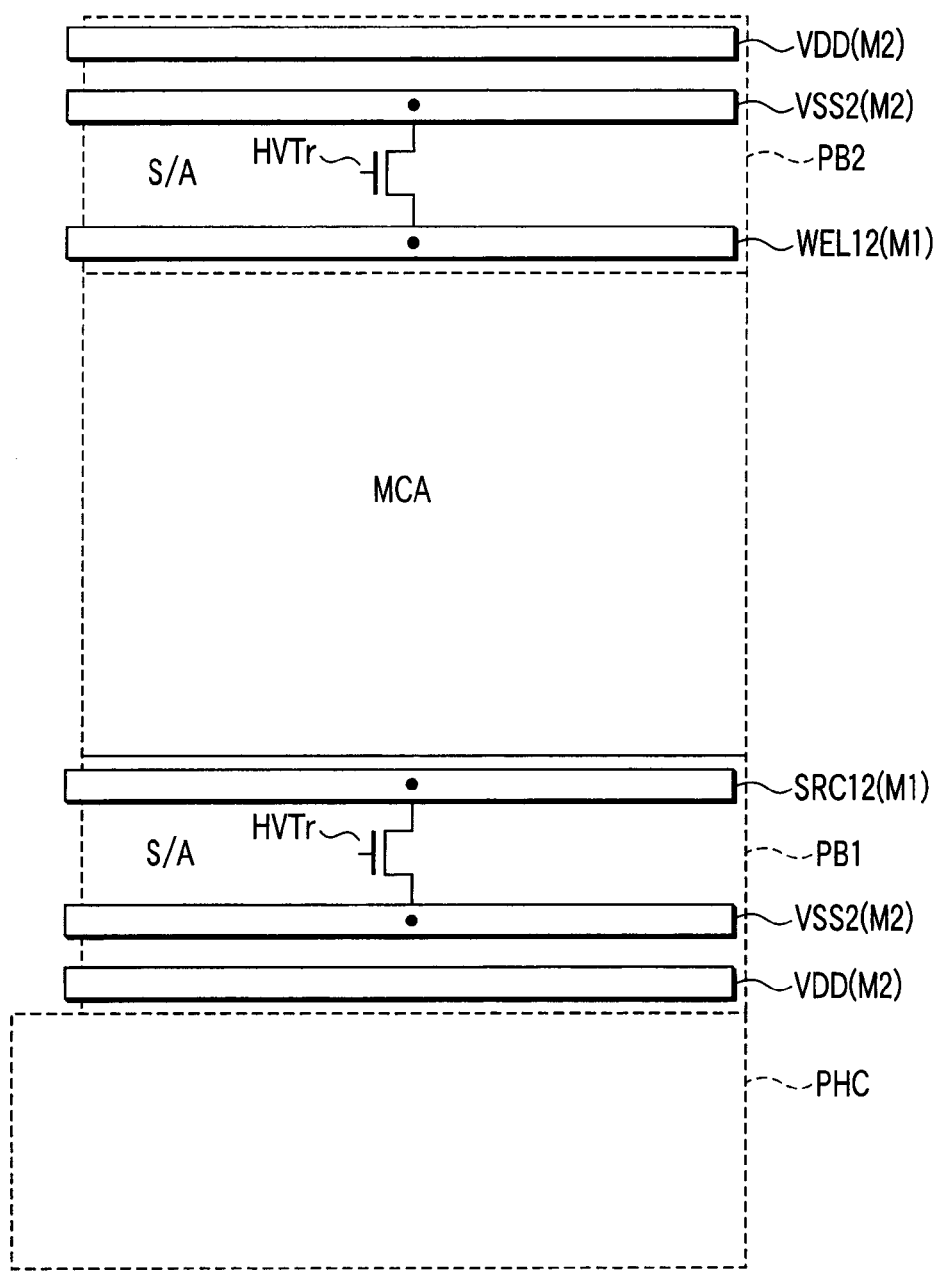
F I G. 9

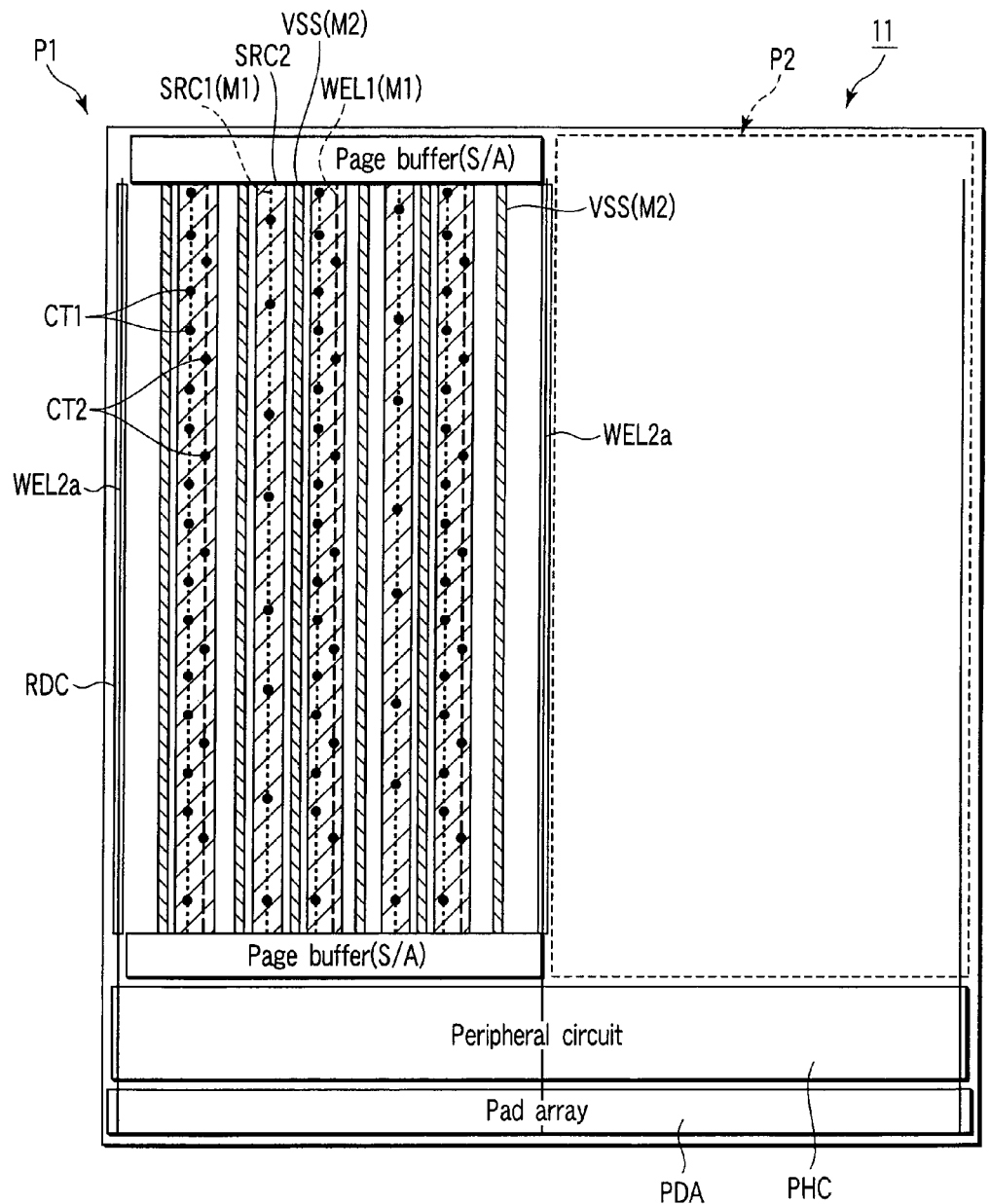
F I G. 11

SEMICONDUCTOR MEMORY DEVICE WITH POWER SUPPLY WIRING ON THE MOST UPPER LAYER

BACKGROUND OF THE INVENTION

1. Field of the Invention

The present invention relates to a nonvolatile semiconductor memory device, for example, a NAND flash memory, and to a wiring pattern for the nonvolatile semiconductor memory device.

2. Description of the Related Art

In general, NAND flash memories have a memory cell array in one p-type well area in order to increase the degree of integration. The p-type well area is electrically connected to a well driver, which supplies a predetermined potential to the p-type well area. Bit lines are densely arranged on the memory cell array, on which a plurality of memory cell transistors (hereinafter referred to as memory cells) are arranged. Consequently, on the area in which the memory cells are arranged, neither cell source lines through which a potential is supplied to cell sources nor cell well lines through which a potential is supplied to the p-type well in which the cells are formed can be arranged in the same wiring layer in which the bit lines are located. Thus, areas (hereinafter referred to as shunt areas) in which no memory cells are arranged are set in the memory cell array. No bit lines are arranged in the shunt areas. Thus, in each of the shunt areas, the p-type well area is connected to the cell well line, and the cell source line is connected to a cell source. That is, the cell source line, connected to a source line driver, or the cell well line, connected to the well driver, is located in a wiring layer on the shunt area. The wiring layer is, for example, the most upper layer in a chip or the layer located immediately below the most upper layer. A technique has been developed which involves arranging the cell source lines and the cell well lines in the most upper layer in the chip or in the layer located immediately below the most upper layer, to transmit potentials from the cell source lines and cell well lines to the cell sources and cell wells (see, for example, Jpn. Pat. Appln. KOKAI Publication No. 2006-245547).

In a NAND flash memory, a memory cell array is located in the center of the chip. A pad array containing power supply pads is located on one side of the memory cell array in a column direction. A page buffer including a sense amplifier is located on the same side of the memory cell array in the column direction and between the memory cell array and the pad array, and another page buffer is located on the other side of the memory cell array in the column direction. That is, the two page buffers are arranged on the respective sides of the memory cell array in the column direction. In this configuration, the pad array is formed on only one of the opposite page buffer sides, enabling a reduction in chip area.

However, as described above, the cell source lines and the cell well lines are arranged in the most upper layer in a chip or in the layer located immediately below the most upper layer. This disadvantageously makes it difficult to route the power supply wiring from the pad array to the page buffer, located on the opposite side of the memory cell array. Of course, increasing the chip size ensures an area on the memory cell array in which the power supply wiring can be located. However, this method results in the tradeoff between the area secured for the power supply wiring and an increase in chip area.

Accordingly, the power supply wiring has been placed, for example, on a row decoder located at one end of the memory cell array in a row direction. However, this may increase the length of the power supply wiring, reduce the width of the wiring, or increase the wiring resistance. Thus, a voltage drop may occur to make it difficult to improve the reliability or margins of the operation of the chip. Further, to inhibit the voltage drop, it is possible to, for example, reduce the operation speed of the circuits or to operate the circuits in chronological order instead of simultaneously operating all the circuits. However, this of course makes it difficult to increase the operation speed. Therefore, it has been desirable to develop a semiconductor memory device that is able to supply sufficient power to a circuit located away from the pad array, while inhibiting a possible increase in chip area.

BRIEF SUMMARY OF THE INVENTION

According to a first aspect of the invention, there is provided a semiconductor memory device comprising a semiconductor substrate; a memory cell array in the semiconductor substrate, the memory cell array having a plurality of memory cells arranged in rows and columns; a first circuit located at one end of the memory cell array in a column direction; a second circuit located at the other end of the memory cell array in the column direction; and a first wire located above the memory cell array between the first circuit and the second circuit, the first wire being located in a most upper layer in the semiconductor substrate to supply power to the second circuit.

According to a second aspect of the invention, there is provided a semiconductor memory device comprising a semiconductor substrate; a memory cell array in the semiconductor substrate, the memory cell array having a plurality of memory cells arranged in rows and columns; a first circuit located at one end of the memory cell array in a column direction; a second circuit located at the other end of the memory cell array in the column direction; and a first wire located in a most upper layer in the semiconductor substrate, the first wire having a plurality of first portions arranged above the memory cell array between the first circuit and the second circuit and a second portion located above the first circuit and connected to the plurality of first portions, the first wire supplying power to the second circuit.

BRIEF DESCRIPTION OF THE SEVERAL VIEWS OF THE DRAWING

FIG. 1 is a partly perspective plan view showing a first embodiment of the present invention;

FIG. 6 is an enlarged plan view showing an area AR1 in FIG. 5;

FIG. 8 is a partly perspective plan view showing a third embodiment of the present invention;

FIG. 9 is a diagram schematically showing a part of FIG. 8;

FIG. 11 is a partly perspective plan view showing a variation of the present invention.

DETAILED DESCRIPTION OF THE INVENTION

Embodiments of the present invention will be described below with reference to the drawings.

Figure 2:
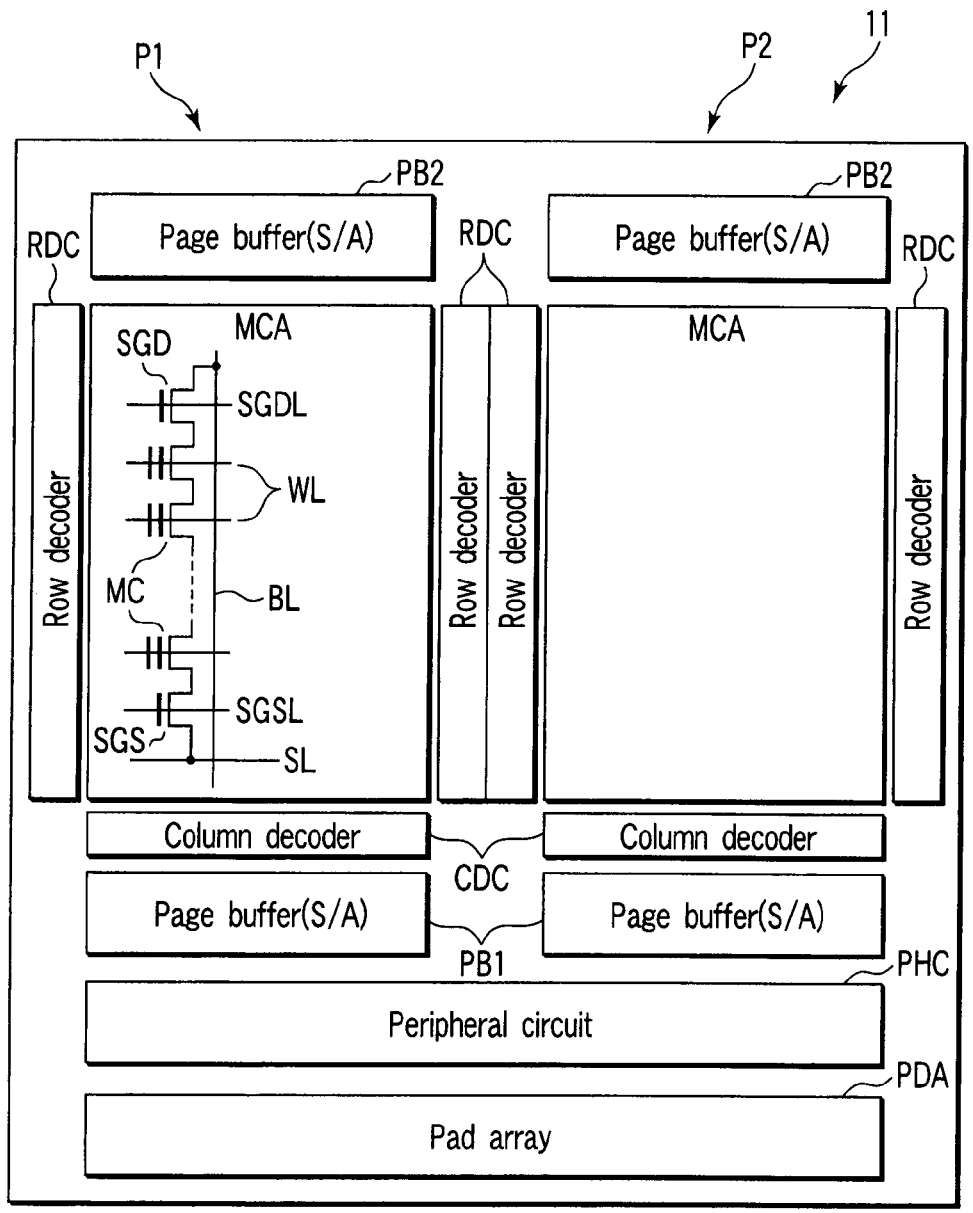
FIG. 2 is a diagram schematically showing a NAND flash memory applied to the present invention.

FIG. 2 shows a schematic configuration of a NAND flash memory to which the present invention is applied. In FIG. 2, a chip 11 has two planes, P1 and P2. The planes P1 and P2 have the same configuration. Each of the planes P1 and P2 has a memory cell array MCA. Row decoders RDC are arranged on the respective sides of each memory cell array MCA in a row direction. Page buffers PB1 and PB2 each including a sense amplifier SA are arranged on the respective sides of each memory cell array MCA in a column direction. A column decoder CDC is located between the page buffer PB1 and the memory cell array MCA. A peripheral circuit PHC is located in the vicinity of the page buffer PB1. A pad array PDA including a plurality of pads is located in the vicinity of the peripheral circuit PHC.

A plurality of memory cell arrays MC is arranged in rows and columns in the memory cell array MCA. The plurality of memory cells MC arranged in columns are connected in series. One end of the memory cells connected in series is connected to a bit line BL via a select gate SGD. The other end of the memory cells is connected to a source line SL via a select gate SGS. Each memory cell is connected to a word line WL. The select gates SGD and SGS are connected to select gate lines SGDL and SGSL. The row decoder RDC selects any of the word lines WL and select gate lines SGDL and SGSL. The column decoder CDC selects any of the bit lines BL.

Figure 3:
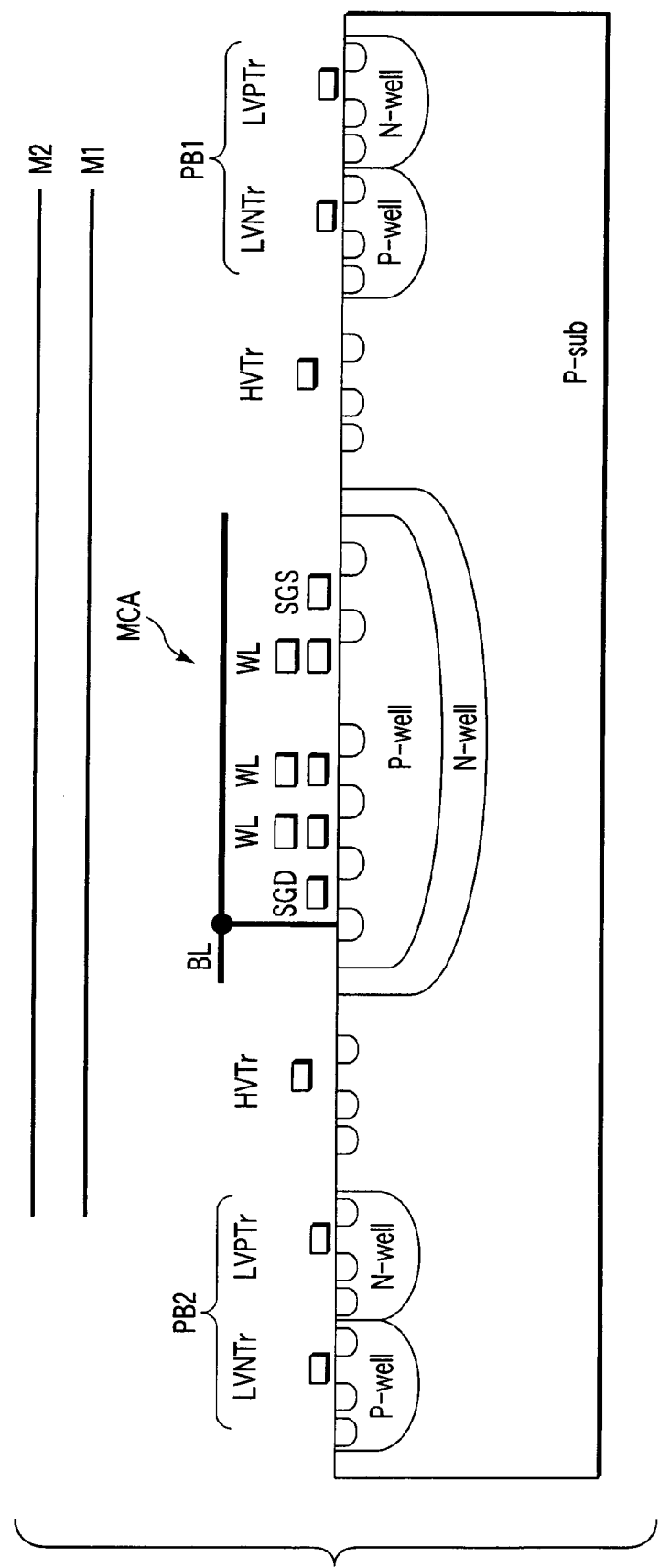
FIG. 3 is a sectional view showing a part of FIG. 2.

FIG. 3 is a sectional view schematically showing a part of FIG. 2. The same components as those in FIG. 1 are denoted by the same reference numerals. For example, a P-type semiconductor substrate (P-sub) has the memory cell array MCA and page buffers PB1 and PB2 formed in the substrate. The memory cell array MCA is formed in a P-type well (P-well). The P-type well is formed in an N-type well (N-well) formed in the P-type semiconductor substrate. The page buffers PB1 and PB2 are composed of a plurality of N channel MOS transistors LVNTr and a plurality of P channel transistors LVPTr. The N channel MOS transistors LVNTr are formed in a P-type well formed in the substrate. The P channel MOS transistors LVPTr are formed in an N-type well formed in the substrate. Moreover, a high breakdown voltage transistor HVTr is formed in the substrate. The high breakdown voltage transistor HVTr is composed of, for example, an N channel MOS transistor. A first metal wiring layer M1 is formed above the substrate, a second metal wiring layer M2 is formed above the first metal wiring layer M1.

First Embodiment

FIG. 1 shows a first embodiment. The planes P1 and P2 have the same wiring, and thus only the plane P1 is shown. In the first metal wiring layer M1 on the memory cell array MCA, a plurality of first cell source lines SRC1 and a plurality of first cell well lines WEL1 are linearly arranged from the page buffer PB1 to the page buffer PB2. For example, each of the first cell well lines WEL1 follows two consecutive first cell source lines SRC1.

A plurality of second cell source lines SRC2 and a plurality of second cell well lines WEL2 are arranged in the second metal wiring layer (M2). The second cell source lines SRC2 are arranged from the page buffer PB1 to the page buffer PB2. Each of the second cell source lines SRC2 is composed of a curved pattern and a pattern in which rectangular rings alternate with straight lines, so as to cross the first cell source lines SRC1 at predetermined intervals. A plurality of contacts CT1 are formed at respective intersections between the first cell source lines SRC1 and the second cell source lines SRC2 to electrically connect the cell source lines together.

Each of the second cell well lines WEL2 is composed of a first portion WEL2a, a second portion WEL2b, and a third portion WEL2c. The first portions WEL2a are linearly arranged on the respective row decoders on the opposite sides of the memory cell array in the row direction. The second and third portions WEL2b and WEL2c have a given length in the row direction. That is, the second portion WEL2b has a length corresponding to the distance between the first portion WEL2a and the first cell well line WEL1, located adjacent to the second portion WEL2b. The third portion WEL2c has a length corresponding to the distance between the adjacent first well lines WEL1.

The second and third portions WEL2b and WEL2c are alternately arranged at equal intervals in the column direction. One end of the second portion WEL2b is connected to the first portion WEL2a. The other end of the second portion WEL2a and the opposite ends of the third portion WEL2c are electrically connected to the first cell well line WEL1 by the contacts CT2.

The contacts CT1 and CT2 are formed in shunt areas in which no memory cells are formed. The first embodiment has two types of shunt areas. The first shunt area SNT1 includes the connection portion between the first and second cell source lines SRC1 and SRC2 and the connection portion between the first and second cell well lines WEL1 and WEL2. The second shunt area is made only of the connection portion between the first and second cell source lines SRC1 and SRC2. In the shunt areas, the first cell line SRC1 and the first cell well line WEL1 are connected via contacts (not shown) to cell sources and cell wells in the memory cell array MCA to supply required potentials for the cell sources and cell wells.

A plurality of power supply lines PWL (VSS or VDD) are continuously arranged in the second metal wiring layer M2 from the page buffer PB1 to the page buffer PB2. The power supply lines PWL are wound in the area between the second cell source lines SRC2. For example, the page buffer PB1 and the page buffer PB2, located away from the page buffer PB1, are supplied with power via the power supply lines PWL. The power supply lines PWL, the second cell source lines SRC2, and the second cell well lines WEL2 are insulated from one another by an insulating film (not shown).

Figure 4:
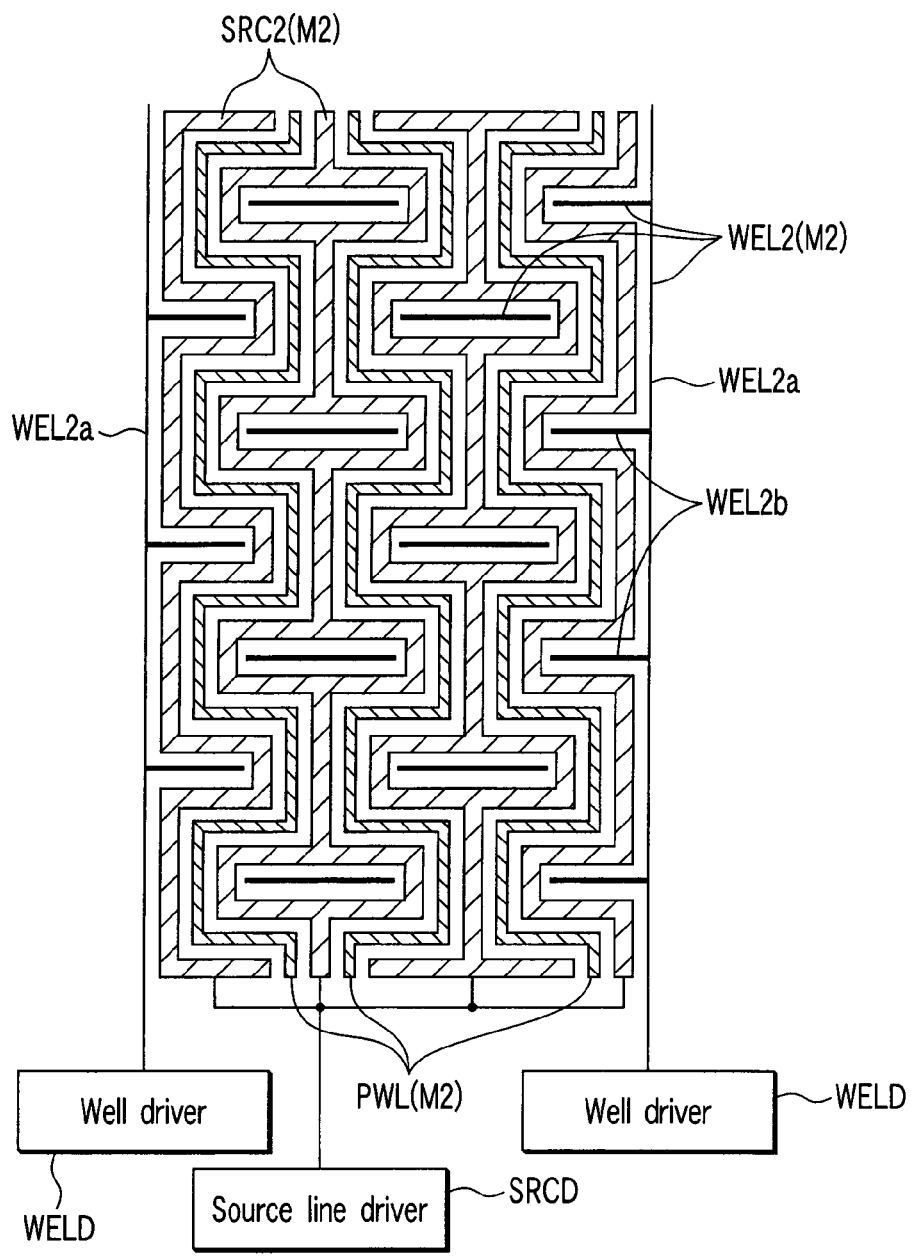
FIG. 4 is a plan view showing a part of FIG. 1.

FIG. 4 shows only the second cell source lines SRC2, second cell well lines WEL2, and power supply lines PWL, formed in the second metal wiring layer M2. The second cell well lines WEL2 are connected to a well driver WELD via the first portion WEL2a. The second cell source lines SRC2 are connected to a source line driver SRCD. The well driver WELD and the source line driver SRCD are arranged in, for example, a peripheral circuit.

According to the above first embodiment, the cell source lines SRC2 and the cell well lines WEL2 are arranged in, for example, the second metal wiring layer M2, the most upper layer, on the memory cell array MCA in curved lines. The power supply lines PWL are arranged along the cell source lines SRC2 and the cell well lines WEL2 in curved lines. The power supply lines PWL can thus be arranged in the most upper layer area. This allows the page buffers PB1 and PB2, arranged on the respective sides of the memory cell array and each including, for example, a sense amplifier, to be electrically connected together by the power supply lines PWL on the memory cell array MCA. The power supply lines PWL arranged in the second metal wiring layer M2 makes it possible to make the power supply wiring PWL shorter than that in the prior art. Furthermore, the power supply lines PWL formed can have a sufficient width. This enables a reduction in the wiring resistance of the power supply lines PWL, allowing sufficient power to be supplied to the peripheral circuit PHC and the page buffer PB2, located away from the pad array PDA. Thus, the operation speed of the circuits can be increased, and the power supply noise can be reduced.

Further, the first and second cell well source lines SRC1 and SRC2 and the first and second cell well lines are connected together in the shunt areas SNT1 and SNT2. Each of the power supply lines PWL is located between the corresponding second cell source line SRC2 and second cell well line WEL2. Thus, the power supply lines PWL can be continuously routed from the page buffer PB1 to the page buffer PB2 without segmentation. This enables a reduction in the resistance of all of the first and second cell source lines SRC1 and SRC2, first and second cell well lines WEL1 and WEL2, and power supply lines PWL.

The power supply lines PWL are not limited to the power supply VDD and the ground line VSS but are of course applicable to other power supplies required for circuit operations.

Second Embodiment

Figure 5:
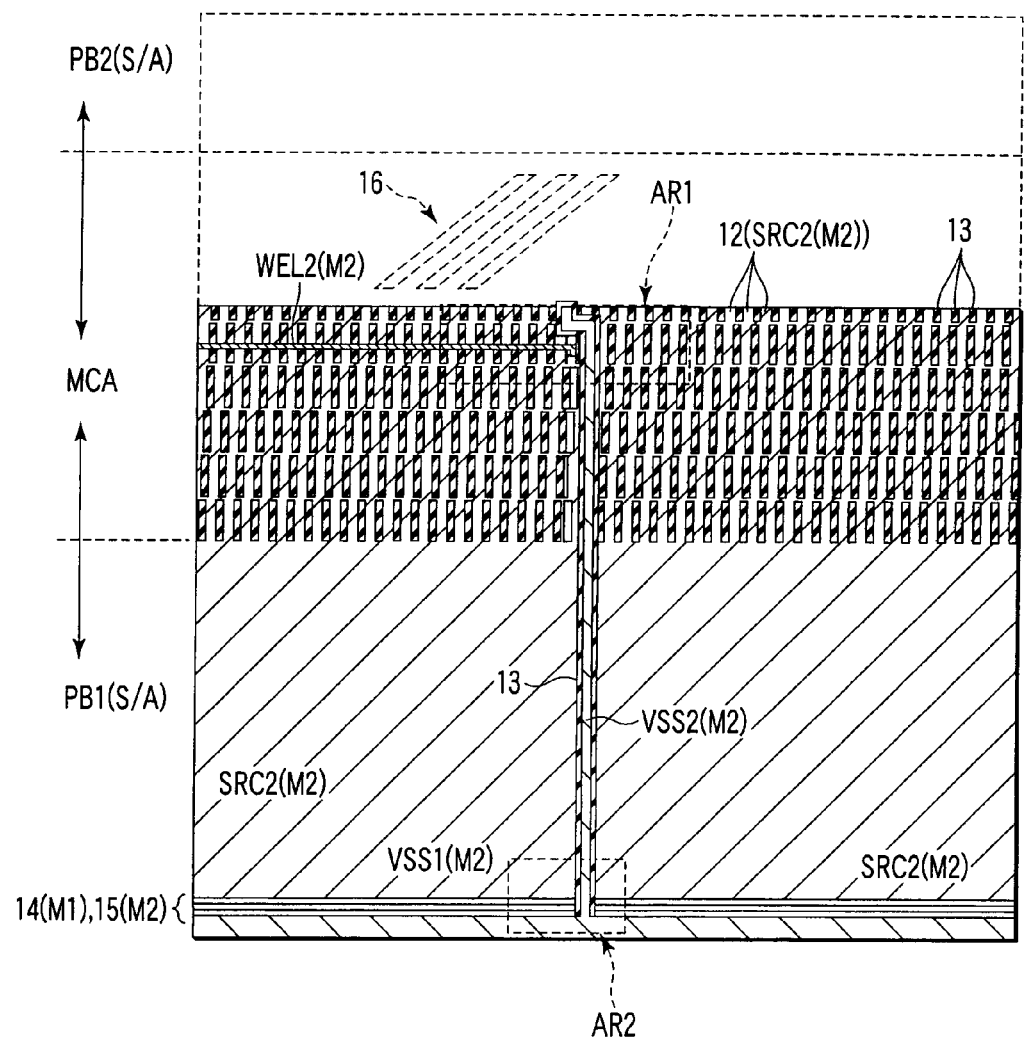
FIG. 5 is a plan view showing a second embodiment of the present invention.

FIG. 5 shows a second embodiment. The same components as those in FIG. 1 are denoted by the same reference numerals. In the first embodiment, the second cell source lines SRC2 are curved. In contrast, in the second embodiment, the second cell source lines SRC2 are meshed.

FIG. 5 shows a part of the memory cell array MCA and the page buffer PB1, including a sense amplifier S/A. The second cell source line SRC2 has a planar pattern covering the entire top surface of the sense amplifier S/A and a meshed pattern partly covering the top surface of memory cell array MCA. Reference numeral 12 denotes a meshed pattern. Reference numeral pattern 13 denotes, for example, an insulating film exposed from the meshed pattern 12.

The second cell well line WEL2 is formed above the memory cell array MCA in the row direction. The second cell well line WEL2 is formed in association with the shunt area. The second cell well line WEL2 is electrically connected to the first cell well line WELL (not shown) by a contact. The second cell well line WEL2 is electrically insulated from the second cell source line SRC2 by the insulating layer 13.

The meshed second cell source line SRC2 is electrically connected to the first cell source line SRC1 via a contact in the shunt area (not shown). The first cell well line WEL1 and the first cell source line SRC1 are linearly formed from the page buffer PB1 toward the page buffer PB2, for example, as shown in FIG. 1.

For example, a ground line VSS1 serving as a power supply line is formed in the second metal wiring layer M2 above the page buffer PB1 so as to extend in the row direction. The ground line VSS1 is insulated from the second cell source line SRC. A ground line VSS2 connected to the ground line VSS1 is formed in the second metal wiring layer M2. The ground line VSS2 is electrically insulated from the second cell source line SRC2 and formed in, for example, a curved line extending from the page buffer PB1 to the page buffer PB2 while bypassing the second cell well line WEL2.

In the first metal wiring layer M1, a plurality of first signal lines 14 are formed between the ground line VSS1 and the second cell source line SRC2 in the row direction. The first signal lines 14 are electrically insulated from the ground line VSS1 and the second cell source line SRC2.

FIG. 6 is an enlarged view of an area AR1 shown in FIG. 5. The ground line VSS2 is located so as to be insulated from the second cell source line SRC2, having the meshed pattern, and the second cell well line WEL2 by the insulating film 13.

Figure 7:
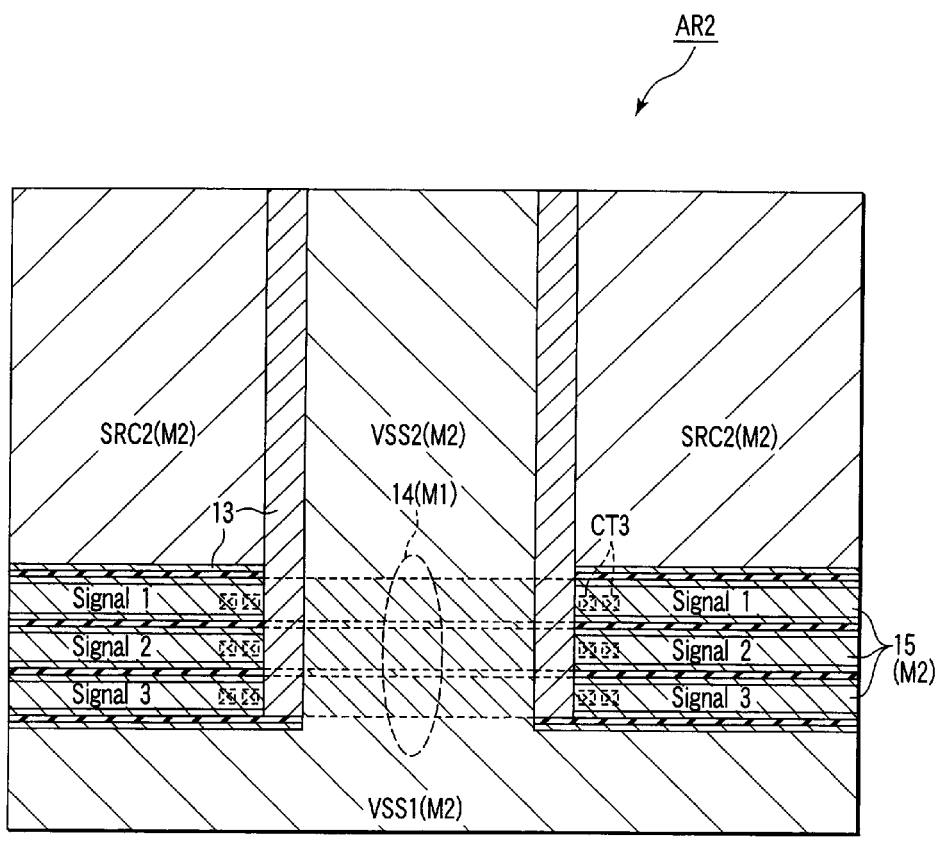
FIG. 7 is an enlarged partly perspective plan view showing an area AR2 in FIG. 5.

FIG. 7 is an enlarged view of an area AR2 shown in FIG. 5. The ground line VSS2 is located on and orthogonally with the first signal line 14. A second signal line 15 is formed in an area in the second metal wiring layer M2 which corresponds to the first signal line 14. The second signal line 15 is insulated from the ground lines VSS1 and VSS2 and the second cell source line SRC2 by the insulating film 13. The second signal line 15 is electrically connected to the first signal line 14 by a contact CT3.

The second embodiment can produce effects similar to those of the first embodiment. Moreover, in the second embodiment, the second cell source line SRC2 is meshed, and the coverage of the top surface of the memory cell array MCA with the second cell source line SRC2 is about 50%. This allows all the bit lines to have a uniform parasitic capacitance. Furthermore, all the bit lines can be considered to have an equivalent coupling capacitance with the cell source line. Consequently, no bit line becomes worst under the effect of these capacitances during pre-charging or sensing of the bit line. This enables an increase in operation speed.

The second cell source line SRC2 need not be meshed. For example, as shown by reference numeral 16 in FIG. 5, the second cell source line SRC2 may have a plurality of patterns inclining at 45 degrees on the memory cell array MCA.

Third Embodiment

FIG. 8 shows a third embodiment. The same components as those in FIG. 1 are denoted by the same reference numerals. In the third embodiment, the cell source line and the cell well line have an almost comb-like pattern so as to mesh with each other on the memory cell array.

That is, the first cell source line SRC1, formed in the first metal wiring layer M1, is composed of a plurality of first portions SRC11 arranged on the memory cell array MCA in the column direction and a second portion SRC12 connected to one end of the first portions SRC11. The second portion SRC12 is located, for example, above the page buffer PB1 in the row direction.

The first cell well line WEL1, located in the first metal wiring layer M1, is composed of a plurality of first portions WEL11, a second portion WEL12, and a third portion WEL13. The plurality of first portions WEL11 are arranged on the memory cell array along the first portion SRC11 of the first cell source line SRC1 at predetermined intervals in the column direction. The second portion WEL12 is located, for example, above the page buffer PB2 along the row direction. One end of the third portion WEL13 is connected to the peripheral circuit PHC.

In the second metal wiring layer M2, each of the plurality of second cell source lines SRC2 is formed above the first portion SRC11 of the first cell source line SRC2. The second cell source line SRC2 and each first portion SRC11 of the first cell source line SRC1 are electrically connected together by the contact CT1. The second cell source line SRC2 and the second portion SRC12 of the first cell source line SRC1 are also electrically connected together by the contact CT1.

The second cell well line WEL2, located in the second metal wiring layer M2, is composed of a plurality of first portions WEL21 and a second portion WEL22. The plurality of second portions WEL21 of the second cell well line WEL2 are arranged above the plurality of first portions WEL11 of the first cell well line WEL1 along the column direction. Each first portion WEL21 of the second cell well line WEL2 is connected to the corresponding first portion WEL11 of the first cell well line WEL1 by the contact CT2. The first portion WEL21 of the second cell well line WEL2 is also electrically connected to the second portion WEL12 of the first cell well line WEL1 by the contact CT2.

The second portion WEL22 of the second cell well line WEL2 is located, for example, above the row decoder RDC along the column direction. One end of the second portion WEL22 of the second cell well line WEL2 is connected to the second portion WEL12 of the first cell well line WELL by the contact CT2. The other end of the second portion WEL22 of the second cell well line WEL2 is connected to the third portion WEL13 of the first cell well line WEL1 by the contact CT2.

The power supply lines VSS and VDD are arranged in the second metal wiring layer M2. The ground line VSS is composed of a plurality of first portions VSS1 and a second portion VSS2. The first portions VSS1 are formed above the memory cell array MCA in the areas other than a first portion SRC21 of the second cell source line SRC2 and the first portions WEL21 of the second cell well line. The first portions VSS1 are arranged from the page buffer PB1 to the page buffer PB2. The second portion VSS2 of the power supply line VSS is continuously formed above the page buffer PB1, the row decoder RDC, and the page buffer PB2. The opposite ends of each of the first portions VSS1 are connected to those of the second portion VSS2 which are formed above the page buffers PB1 and PB2. Moreover, the ground line VSS is connected to the peripheral circuit PHC by a third portion VSS3 formed in the first metal wiring layer M1.

The power supply line VDD is continuously formed above the page buffer PB1, the row decoder RDC, and the page buffer PB2 and is partly connected to the peripheral circuit PHC.

The plurality of contacts CT1 and CT2 on the memory ell array MCA are formed in the shunt areas. The second embodiment has the two types of shunt areas taking into account the reduced width of the shunt areas in the memory cell array MCA. The first shunt area SNT1 connects the plurality of first well lines WEL11 to the second portion WEL21 of the second cell well line WEL2. The second shunt area SNT2 connects the first cell source line SRC11 and the second cell source line SRC2 together.

FIG. 9 schematically shows arrangements on the page buffers PB1 and PB2. In the page buffer PB1, the second portion SRC12 of the first cell source line SRC1 is connected to the ground line VSS2 via a high breakdown voltage transistor HVTr. The high breakdown voltage HVTr is formed, for example, in an area in which the sense amplifier S/A of the page buffer PB1 is formed.

In the page buffer PB2, the second portion WEL12 of the first cell well line WEL1 is connected to the ground line VSS2 via the high breakdown voltage transistor HVTr. The high breakdown voltage HVTr is formed, for example, in an area in which the sense amplifier S/A of the page buffer PB2 is formed. The high breakdown voltage transistor HVTr is turned on to ground the first cell source line SRC1 or the first cell well line WEL1.

In the third embodiment, the second cell source lines SRC2 and the first portions WEL21 of the second cell well line WEL2 are linearly arranged in the second metal wiring layer M2 on the memory cell array MCA. The first portions VSS1 of the ground line VSS, constituting the power supply line, are linearly arranged along the second cell source lines SRC2 and the first portions WEL21 of the second cell well line WEL2. Thus, the first portions VSS1 of the ground line VSS can be routed so as to take the shortest way from the page buffer PB1 to the page buffer PB2. This enables a reduction in wiring length and in wiring resistance.

The first portions WEL21 of the second cell well line WEL2 are connected, by the contacts CT2, to the respective fine first portions WEL11 of the plurality of first cell well lines WEL1, arranged in the first metal wiring layer M1. Thus, even with the reduced width of the shunt areas in the memory cell array MCA, required potentials can be supplied to the wells in the memory cell array MCA.

Fourth Embodiment

In the first to third embodiments, the ground line VSS and the power supply line VDD are arranged above the memory cell array MCA for the page buffer PB1 to the page buffer PB2. However, the present invention is not limited to this. For example, a control signal line may be formed above the memory cell array MCA.

Figure 10:
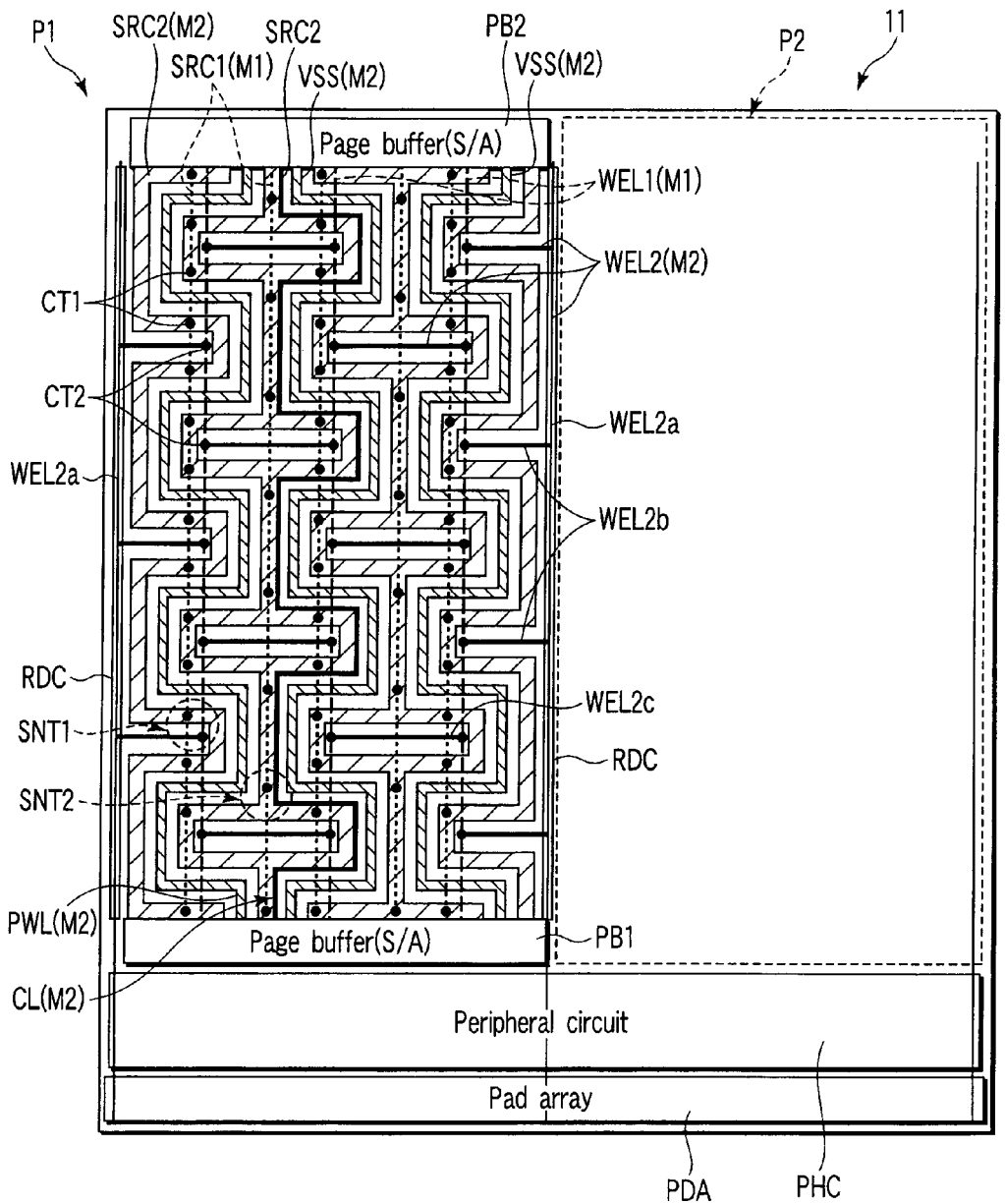
FIG. 10 is a partly perspective plan view showing a fourth embodiment of the present invention.

FIG. 10 shows a fourth embodiment. The same components as those in FIG. 1 are denoted by the same reference numerals, and only differences from the above embodiments will be described.

In FIG. 10, a control signal line CL is formed in the second metal wiring layer M2 in the area between the ground line VSS, serving as the power supply line PWL, and the second cell source line SRC2. The control signal line CL is electrically insulated from the ground line VSS and the second cell source line SRC2 and transfers a control signal from the page buffer PB1, located closer to the pad array PDA, to the page buffer PB2.

According to the fourth embodiment, the control signal line CL is located in the second metal wire layer M2, corresponding to the most upper layer in the memory cell array MCA. Thus, the control signal line CL with a reduced resistance can be easily formed. This enables the control signal to be transmitted from the page buffer PB1 to the page buffer PB2 at a high speed, enabling the memory to operate at a high speed.

FIG. 11 shows a variation of the first to fourth embodiments. In this case, the first cell source lines SRC1, the second cell source lines SRC2, the first cell well lines WEL1, and the ground lines VSS, serving as the power supply lines PWL are linearly arranged. The second cell well line WEL2 is linearly located above the row decoder RDC.

The variation allows the ground lines VSS, serving as the power supply lines PWL, to be arranged from the page buffer PB1, located closer to the pad array PDA, to the page buffer PB2. Therefore, the variation can produce effects similar to those of the first to fourth embodiments.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a semiconductor substrate;
    a memory cell array in the semiconductor substrate, the memory cell array having a plurality of memory cells arranged in rows and columns;
    a first circuit located at one end of the memory cell array in a column direction;
    a second circuit located at the other end of the memory cell array in the column direction; and
    a first wire located above the memory cell array between the first circuit and the second circuit, the first wire being located in a most upper layer in the semiconductor substrate to supply power to the second circuit.

2. The device according to claim 1, further comprising a second wire located in a layer below the most upper layer in the semiconductor substrate and above the memory cell array, the second wire being located between the first circuit and the second circuit to supply a potential to a source of any of the memory cells.

3. The device according to claim 2, further comprising a third wire located in a layer below the most upper layer in the semiconductor substrate and above the memory cell array, the third wire being located between the first circuit and the second circuit to supply a potential to a well.

4. The device according to claim 2, further comprising a fourth wire located in the most upper layer in the semiconductor substrate and between the first circuit and the second circuit, the fourth wire having a first intersecting portion which intersects with the second wire, the fourth wire being electrically connected to the second wire at the first intersecting portion.

5. The device according to claim 3, further comprising a fifth wire located in the most upper layer in the semiconductor substrate, the fourth wire having a second intersecting portion which intersects with the third wire, the fifth wire being electrically connected to the third wire at the first intersecting portion.

6. The device according to claim 1, wherein the first and second circuits are sense amplifiers.

7. The device according to claim 1, wherein the first wire is a ground line.

8. The device according to claim 4, wherein the fourth wire has a meshed pattern.

9. The device according to claim 4, wherein the fourth wire has a pattern inclining in the column direction.

10. A semiconductor memory device comprising:
a semiconductor substrate;
a memory cell array in the semiconductor substrate, the memory cell array having a plurality of memory cells arranged in rows and columns;
a first circuit located at one end of the memory cell array in a column direction;
a second circuit located at the other end of the memory cell array in the column direction; and
a first wire located in a most upper layer in the semiconductor substrate, the first wire having a plurality of first portions arranged above the memory cell array between the first circuit and the second circuit and a second portion located above the first circuit and connected to the plurality of first portions, the first wire supplying power to the second circuit.

11. The device according to claim 10, further comprising a second wire located in a layer below the most upper layer in the semiconductor substrate, the second wire having a plurality of third portions located above the memory cell array between the first circuit and the second circuit and a fourth portion located above the first circuit and connected to the plurality of third portions, to supply a potential to a source of any of the memory cells.

12. The device according to claim 11, further comprising a third wire located in a layer below the most upper layer in the semiconductor substrate, the third wire having a plurality of fifth portions located above the memory cell array along the third portions and a sixth portion located above the second circuit, to supply a potential to a well.

13. The device according to claim 12, further comprising a fourth wire located in the most upper layer in the semiconductor substrate and between the first circuit and the second circuit, the fourth wire being electrically connected to the second wire.

14. The device according to claim 13, further comprising a fifth wire located in the most upper layer in the semiconductor substrate, the fourth wire electrically connecting the plurality of fifth portions of the third wire to the sixth portion.

15. The device according to claim 10, wherein the first and second circuits are sense amplifiers.

16. The device according to claim 10, wherein the first wire is a ground line.

17. The device according to claim 12, wherein the first wire has a seventh portion located in the most upper layer in the semiconductor substrate and above the second circuit, the seventh portion electrically connecting the plurality of first portions together.

18. The device according to claim 11, further comprising a transistor which connects the second portion of the first wire to the fourth portion of the second wire.

19. The device according to claim 1, further comprising a signal line located in the most upper layer in the semiconductor substrate and insulated from the first wire, the signal line being located between the first circuit and the second circuit.

20. The device according to claim 12, wherein the first portions, the third portions, the fifth portions, the second wire, and the third wire have linear patterns.

* * * * *